US012785655B2

(12) United States Patent
Schaffer et al.

(10) Patent No.: US 12,785,655 B2
(45) Date of Patent: Nov. 3, 2026

(54) OVERMODED BULK ACOUSTIC RESONATORS AND METHOD OF FABRICATING

(71) Applicant: CARNEGIE MELLON UNIVERSITY, Pittsburgh, PA (US)

(72) Inventors: Zachary Schaffer, Pittsburgh, PA (US); Gianluca Piazza, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 148 days.

(21) Appl. No.: 18/614,849

(22) Filed: Mar. 25, 2024

(65) Prior Publication Data

US 2024/0322790 A1 Sep. 26, 2024

Related U.S. Application Data

(60) Provisional application No. 63/454,207, filed on Mar. 23, 2023.

(51) Int. Cl.
*H03H 9/17* (2006.01)
*H03H 9/02* (2006.01)
*H03H 9/56* (2006.01)

(52) U.S. Cl.
CPC .......... *H03H 9/17* (2013.01); *H03H 9/02015* (2013.01); *H03H 9/566* (2013.01)

(58) Field of Classification Search
CPC ............ H03H 9/566; H03H 3/02; H03H 9/17; H03H 9/02015; H03H 9/175
See application file for complete search history.

(56) References Cited

U.S. PATENT DOCUMENTS 12,052,010 B2 * 7/2024 Fattinger ................ H03H 9/131
2006/0119230 A1 * 6/2006 Umeda .................. H03H 9/175 310/358
2011/0084779 A1 * 4/2011 Zhang ...................... H03H 3/02 333/187
2020/0076397 A1 * 3/2020 Liou .................... H03H 9/0523
2022/0123729 A1 * 4/2022 Burak .................... H03H 9/131
2022/0140806 A1 * 5/2022 Burak ................ H03H 9/02259 333/187
2023/0124493 A1 * 4/2023 Shin ....................... H03H 9/173 333/187
2023/0216476 A1 * 7/2023 Burak ...................... H03H 9/13 331/154
2023/0231539 A1 * 7/2023 Burak .................... H03H 9/131 333/187
2024/0097642 A1 * 3/2024 Ella ........................ H03H 9/568

* cited by examiner

*Primary Examiner* — Quan Tra
(74) *Attorney, Agent, or Firm* — KDW FIRM PLLC

(57) ABSTRACT

Disclosed herein is an Overmoded Bulk Acoustic Resonator (OBAR) and a solidly-mounted OBAR (SBAR), which operate in a partially transduced 2nd overtone split between piezoelectric and electrode layers using dual all metal Bragg mirrors. The devices may be deployed in a series configuration. The devices have arbitrarily thick electrodes to minimize ohmic loss and bandwidths high enough to meet filtering requirements of 5G networks. The devices provide sharp filtering which can be performed directly at each antenna element in a form factor much smaller than the half-wavelength separation between adjacent antenna elements required when using electromagnetic resonators.

5 Claims, 15 Drawing Sheets

OVERMODED BULK ACOUSTIC RESONATORS AND METHOD OF FABRICATING

RELATED APPLICATIONS

This application claims the benefit of U.S. Provisional Patent Application No. 63/454,207 filed Mar. 23, 2023, the contents of which are incorporated herein in its entirety.

GOVERNMENT INTEREST

This invention was made with U.S. Government support under contract HR0011-22-2-0026, awarded by the Defense Advanced Research Projects Agency (DARPA). The U.S. government has certain rights in this invention.

BACKGROUND OF THE INVENTION

Demand for wireless data is growing at an astounding rate of up to 30% per year. Current wireless infrastructure cannot accommodate this growth rate. The 5th Generation (5G) cellular network technology is meant to address these needs by enabling communication data links in the millimeter wave (mmW) range (typically in the range of 30 GHz to 60 GHZ) using phased arrays. The way we communicate has been revolutionized by 5G technology by facilitating high speed data links for augmented and virtual reality, unmanned air vehicles and self-driving cars, remote health and infrastructure monitoring and the Internet of Everything. As the number of deployed 5G systems increases, the number of bits required by the baseband analog-to-digital converter (ADC) of each channel (or element in the phased array) is limited by interference levels. Filtering will thus be essential in limiting the power consumption of ADCs for each element in the phased array as well as reducing the linearity requirements on the amplifiers. The need for mm-wave filtering will be a fundamental bottleneck to further deployment of 5G networks.

Commercial solutions for 5G phased arrays use a combination of RF and digital beamforming technologies. For both, it is likely that the main bottleneck for large scale roll out will be the ability to suppress interferers. The number of bits required by baseband analog-to-digital converters (ADCs) for each element in the array will likely not be limited by signal to noise ratio (SNR), typically <0 dB, but rather by high interference levels. To suppress these interferers, high performance filters at the antenna level will be required. Although these filters are not used in current implementations, as the mmWave spectrum becomes more and more crowded, the number of interferes will increase and so will the requirements for filtering. These filters are necessary to keep power consumption on the per element ADCs reasonable (by limiting the number of bits), as well as minimize amplifier linearity requirements. Phased arrays with per element filtering require filters much smaller than the half-wavelength separation of the adjacent phased array antenna elements.

While other approaches for performing filtering functions at mmWave frequencies have been demonstrated, these techniques are all based on the use of electromagnetic resonators. Regardless of whether waveguide resonators, low-temperature co-fired ceramic cavity resonators, loaded cavity resonators, microstrip filter resonators, or laminated core resonators are used, the filter dimensions are fundamentally limited by the size of the electromagnetic wavelength at these frequencies. The smallest demonstrated filters for mmWave range far exceed the required half EM wavelength spacing, making them impractical for use at each antenna element (which are also generally spaced by ½ of the electromagnetic wavelength). Acoustic resonators, due to their much lower phase velocity (a few thousands m/see for acoustic waves vs. ~$10^8$ m/sec for electromagnetic waves), enable extremely small form factors, potentially only a few microns on a side per device), allow insertion past each antenna element and enable extremely small form factors at mm-waves (potentially only a few microns on a side per device) and are likely to be the only viable approach for the implementation of direct filtering at each antenna element in a phased array.

The design of an acoustic resonator should achieve the following goals: 1) attaining a high electromechanical coupling, which facilitates the synthesis of low loss and wideband filters; 2) achieving high quality factor (Q) to minimize filter losses and ensure steep roll-off; and 3) demonstrating impedances matched to 50Ω in a small form factor so as to minimize the need for external matching components. Earlier work on 10-50 GHz acoustic resonators has shown that it is feasible to demonstrate vibrating mechanical devices operating in the mm-wave frequency range. Work on piezoelectric aluminum nitride resonators shows that 28 GHz resonators can be demonstrated in nanoscale films and very small form factors (i.e., just few microns on a side). These devices could be matched to 50Ω but suffer from relatively large losses and demonstrated Qs below 200, making them far less competitive with respect to alternative electromagnetic-based filtering technologies in terms of resulting filter losses and roll-off. Works by the MEMS community have confirmed that aluminum nitride films or doped films can operate at these frequencies and in topologies which support either higher quality factors (Q~500) or a large electromechanical coupling coefficient ($k_t^2$) of around 10%. The integration of resonators in advanced CMOS processes has facilitated the insertion of innovative phononic crystal designs into electrostrictive acoustic resonators, which have exhibited exceptionally high-Q (i.e., in excess of 10,000) at mm-wave frequencies. The low $k_t^2$ intrinsic to the electrostrictive transducer renders the device characteristic impedance very high and, most importantly, limits the attainable filter bandwidth, making such devices impractical for 5G filtering applications.

However, high-Q at mm-wave is possible. The exploration of alternative ferroelectric thin films made available by atomic layer deposition, such as $HfO_2$, have enabled the demonstration of mm-wave vibrations in various resonator geometries. Despite this progress, these devices still suffer from large impedances and high losses, limiting their Qs to be below 300 at the highest frequencies. Other works on overmoded acoustic resonators in thin films of lithium niobate has shown that such devices can support frequencies up to 50 GHz with Qs on the order of a few 100 s. Despite the acceptable electromechanical coupling, the method of excitation of these modes of vibrations make it impractical to attain the desired characteristic impedances in a competitive form factor or ways that would ensure accurate frequency setting.

SUMMARY OF THE INVENTION

Disclosed herein is an Overmoded Bulk Acoustic Resonator (OBAR) and a solidly-mounted OBAR (SBAR), which operate in a partially transduced 2nd overtone split between piezoelectric and electrode layers, and which use dual all metal Bragg mirrors in series arrays of devices. The devices have arbitrarily thick electrodes to minimize ohmic loss and bandwidths sufficient to meet filtering requirements. The devices provide sharp filtering which can be performed directly at each antenna element, in a form factor much smaller than the half-wavelength separation between adjacent antenna elements required when using traditional acoustic resonators.

The disclosed device, fabricated by the disclosed method, mitigates the scaling challenges encountered in other bulk acoustic resonator technologies by allowing arbitrarily thick metal electrodes, a piezoelectric layer 2× thicker, and electromechanical coupling coefficients ($k_t^2$) in excess of 10%. This is achieved through 3 main design/fabrication features. First, the device operates in an overtone which confines energy in the piezoelectric layer. Second, a metal Bragg mirror is used to confine energy as well as minimizing series resistance losses and facilitating routing. Third is the integration of high coupling Y-36 LN layers by means of a layer transfer process.

A Solidly Mounted OBAR, referred to herein as "SBAR", consists of a piezoelectric layer sandwiched between two all metal Bragg mirrors, encapsulation and interconnects. The SBAR functions in a 2nd overtone. However, instead of confining acoustic energy solely to the piezoelectric layer, the mode is split between the piezoelectric layer and each electrode. The piezoelectric layer and each electrode have thicknesses equal to ½ the acoustic wavelength (λ), leading to a mode shape within the transduced region (piezoelectric layer) similar to a fundamental thickness extensional mode. This prevents the typical problem of overtones in which regions of expansion and contraction produce positive and negative polarizations which cancel, reducing $k_t^2$. This design allows ~⅔ the $k_t^2$ of a fundamental thickness extensional mode.

Exemplary embodiments of the OBAR are fabricated using a 5-step process shown in FIG. 11 and the SBAR devices are fabricated using a 9-step process shown in FIG. 13. The fabrication process is discussed in detail in the Detailed Description section herein.

DETAILED DESCRIPTION

Figure 1:
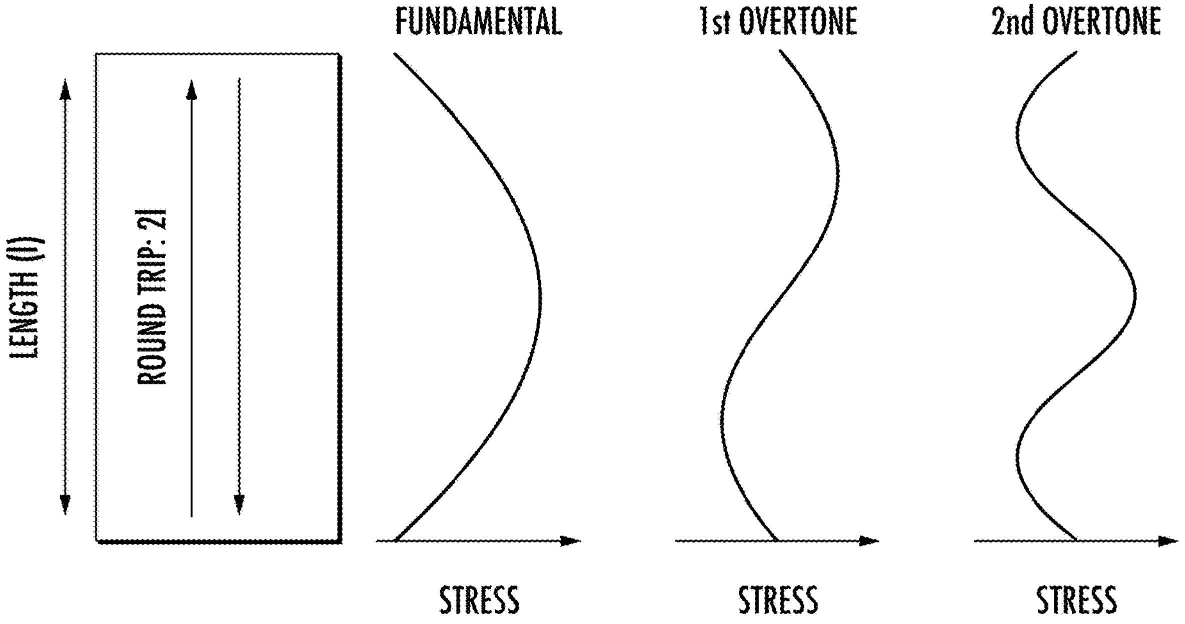
FIG. 1 is a schematic representation of the acoustic cavity for a 1D thickness extensional mode showing stress for fundamental, 1st overtone, and 2nd overtone.

In an acoustic resonator, resonance occurs when a mechanical stimulus is applied at a specific frequency so that it adds constructively to build up a standing wave. The fundamental frequency for an acoustic resonance is determined by the wave's phase velocity ($v_{phase}$) and the round trip path length which, in the case of a thickness mode, is 2 times the thickness, as shown in FIG. 1. If the stimulus is applied at higher multiples of the fundamental frequency, overtones are created. Using Eq. (1), the fundamental mode is referred to as n=0 and the 2nd overtone as n=2. It can be helpful to compare the frequency ratio between the fundamental and target overtone to ensure understanding of the mode.

$$f_n = (n+1)\cdot\frac{1}{2l}v_{phase}$$

Overtones allow a higher resonant frequency in the same size acoustic cavity, making it an attractive approach for scaling to mmWave acoustic resonators. Using a piezoelectric material allows conversion between electrical and mechanical domains with an electromechanical coupling coefficient ($k_t^2$) dependent on the piezoelectric properties of the material. Exciting an overtone instead of the fundamental mode reduces $k_t^2$. In a uniform piezoelectric material, only even overtones can be transduced as the charge generated in odd modes fully cancels. For the even modes, $k_t^2$ reduces quadratically as shown in Eq. (2):

$$\frac{k_{t_n}^2}{k_{t_{fundamental}}^2} = \frac{1}{(n+1)^2} \text{ for even } n \quad (2)$$

where n is the overtone number

Figure 2:
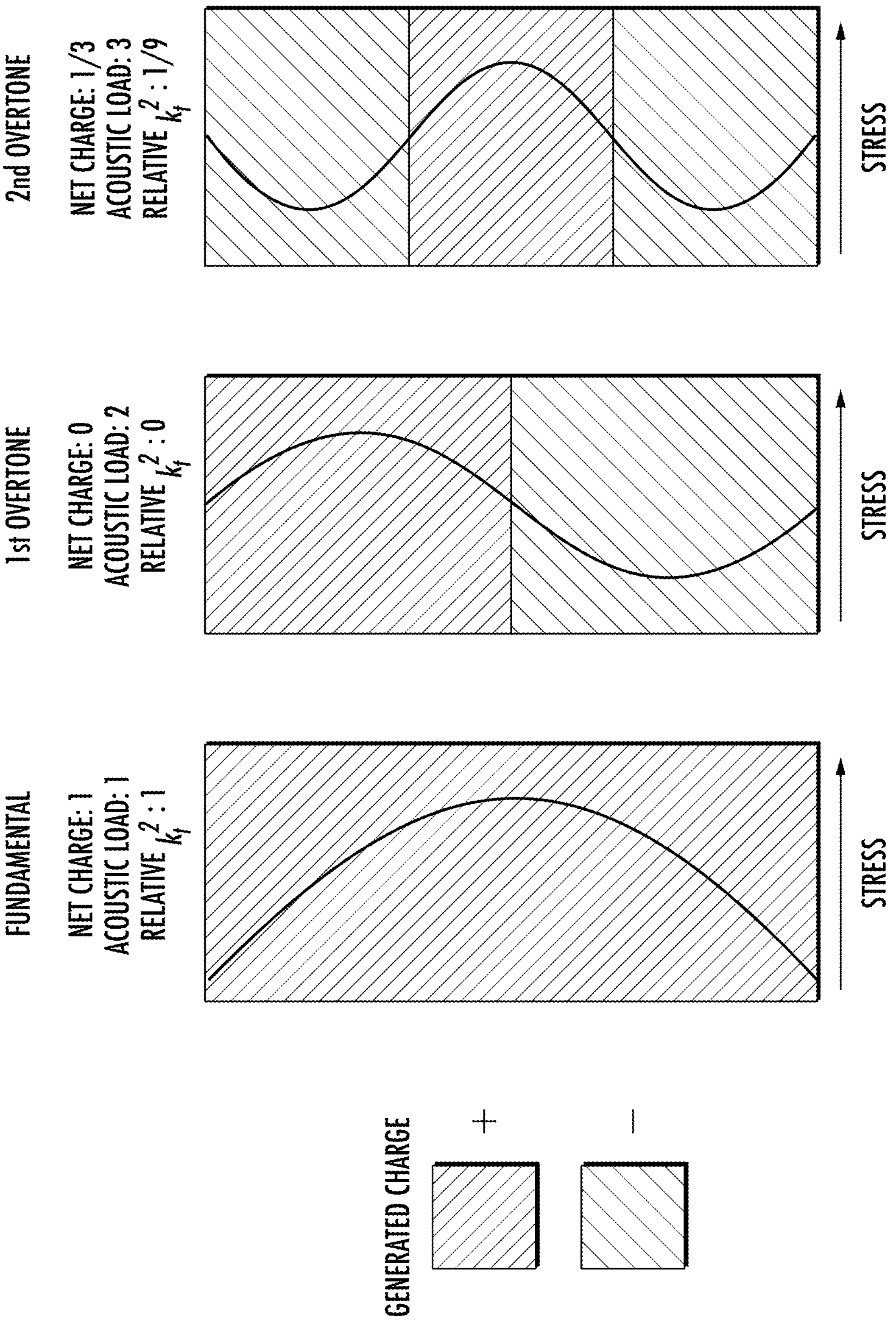
FIG. 2 shows 1D thickness extensional mode showing stress and piezoelectric charge generation for fundamental, 1st overtone, and 2nd overtone modes.

This is caused by both increased acoustic load and cancellation of charge from out of phase nodes. For a second overtone in a uniform piezoelectric material, $k_t^2$ is 1/9 of the fundamental mode, as shown in FIG. 2. This device $k_t^2$ is too low for many filter applications.

Figure 3:
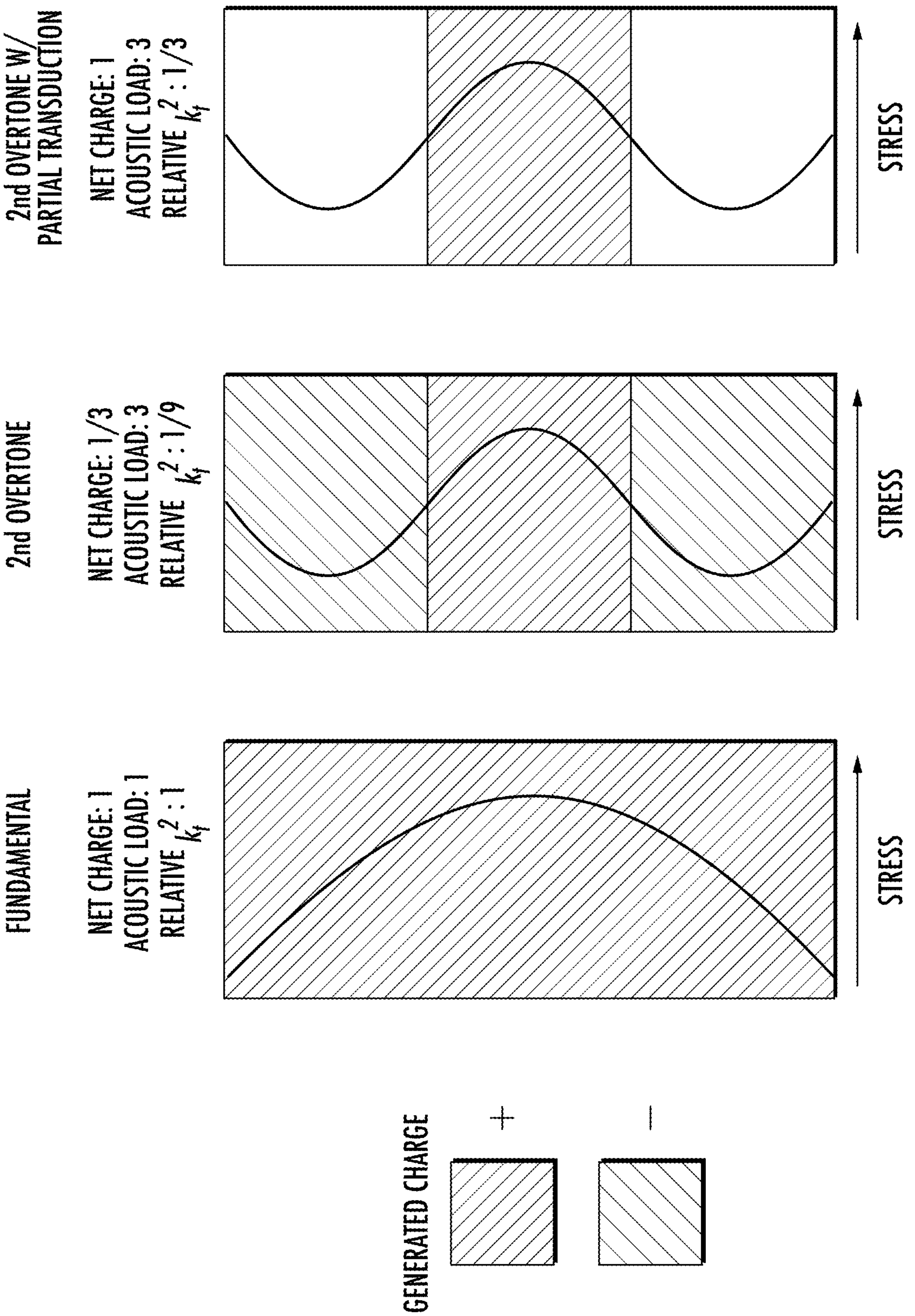
FIG. 3 shows 1D thickness extensional mode showing stress and piezoelectric charge generation for fundamental, fully transduced 2nd overtone, and partially transduced 2nd overtone modes.

The OBAR functions in a 2nd overtone, but instead of confining acoustic energy solely to the piezoelectric layer, the mode is split evenly between the piezoelectric layer and each electrode. The piezoelectric layer and each electrode have thicknesses equal to ½ the acoustic wavelength (λ), causing only the center node to be in the transduced region (piezoelectric layer), leading to a transduced mode shape similar to a fundamental mode. This prevents the typical problem of overtones in which regions of expansion and contraction produce positive and negative polarizations, which cancel net charge, thereby reducing $k_t^2$. Assuming uniform acoustic properties and layer thickness, $k_t^2$ is ⅓ of the fundamental mode as shown in FIG. 3.

This can be further improved to ⅔ of the fundamental mode $k_t^2$ by optimizing layer thickness and material selection. To understand this impact, it is helpful to evaluate materials based on acoustic impedance (Z) and acoustic phase velocity ($v_{phase}$) as defined in Eq. (3)-(4) based on density (ρ) and Young's modulus (E):

$$v_{phase} = \sqrt{\frac{E}{\rho}} \quad (3)$$

$$Z = \sqrt{E \cdot \rho} \quad (4)$$

Figure 4:
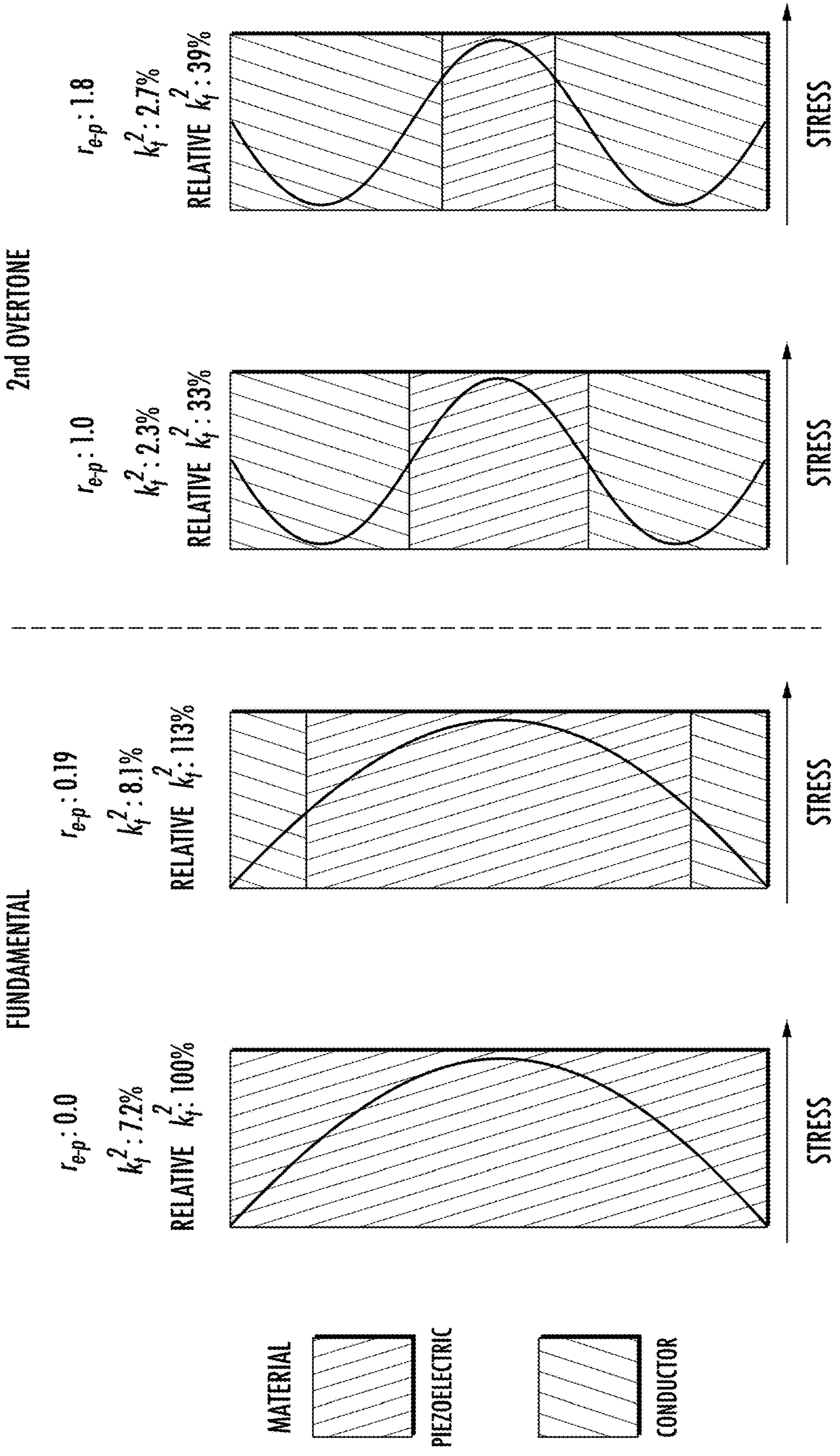
FIG. 4 shows fundamental and partially transduced 2nd overtone mode for an Aluminum Nitride (AlN) uniform acoustic property stack consisting of an electrically piezoelectric and conductive region, showing stress distribution and electrode to piezoelectric layer ratio (re-ρ).

To have a second overtone where one node is present in each layer requires equal effective path length which can be determined by layer thickness and the propagation speed (c) through the layer. Therefore, using slower phase velocity materials results in higher thicknesses. $k_t^2$ is a function of how much charge is captured from the transduced region. Charge density is not uniform, but rather sinusoidal with a maximum in the center. Therefore, not transducing the outermost edges of the mode enhances $k_t^2$. The mode can be simulated in an infinitely wide plate using 2D COMSOL Finite Element Analysis (FEA) simulations. In this simulation the center "piezoelectric" layer is AlN and the outer "electrode" layer modeled as a perfect conductor. Therefore, only the center piezoelectric layer generates and transduces charge. In this simulation, all layers have the same $v_{phase}$ and Z. By increasing the ratio of electrode to piezoelectric region (re-ρ), so that only ⅔s of the center node is transduced. $k_t^2$ is improved from 2.3%-2.7%. Compare this to the 7.2% $k_t^2$ of a fundamental mode pure AlN to give relative $k_t^2$ of 33% and 38% respectively. FIG. 4 shows the difference in mode shape, and the relation between re-ρ and $k_t^2$ for a uniform acoustic property stack.

Figure 5:
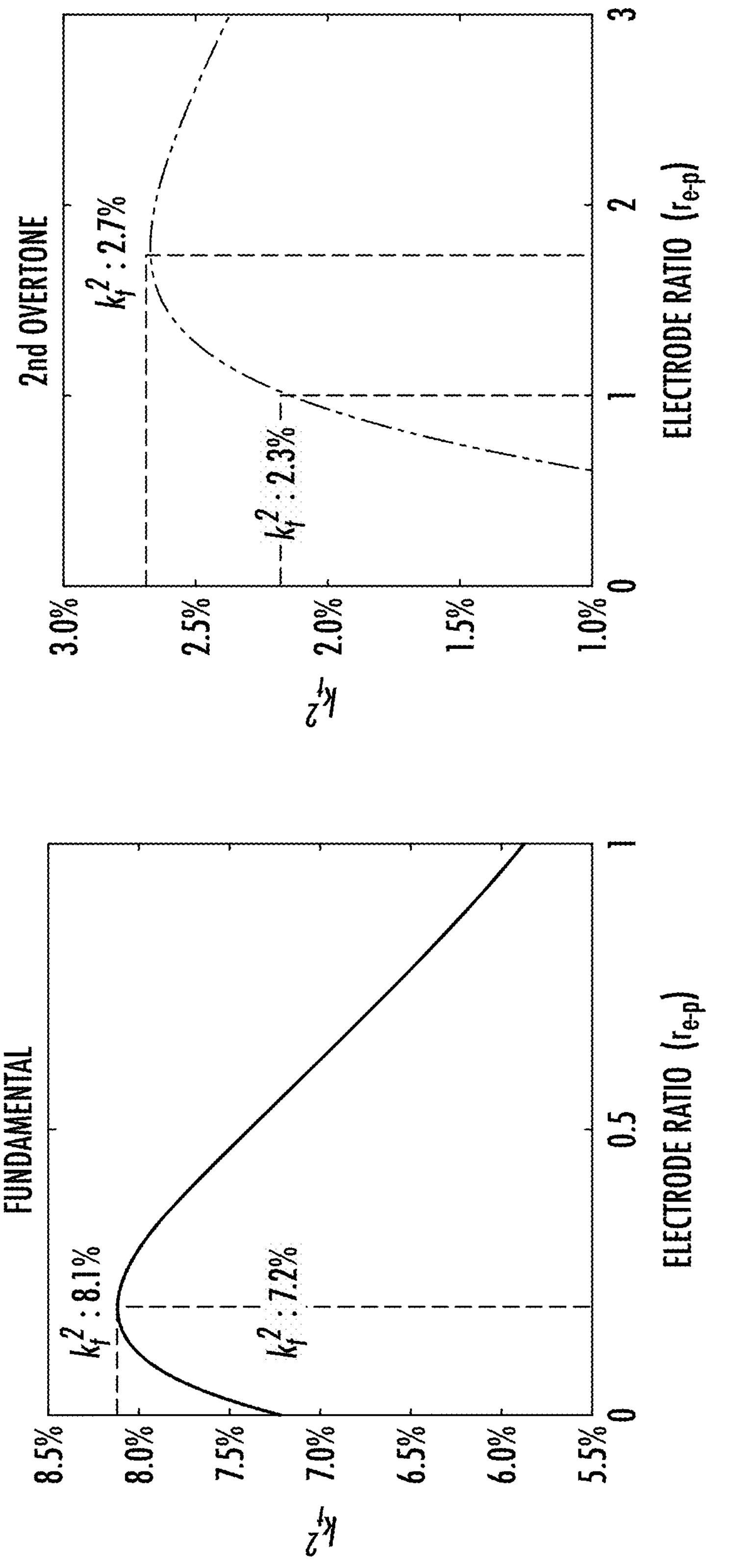
FIG. 5 shows the results of FEA study sweeping electrode to piezoelectric ratio to determine $k_t^2$. The stack is composed a piezoelectric layer with AlN properties and a conductor layer with the stiffness and density of AlN but instead of piezoelectric properties is an ideal conductor. Note that the optimal ratio of electrode to piezoelectric material allows enhanced $k_t^2$.
Figure 6:
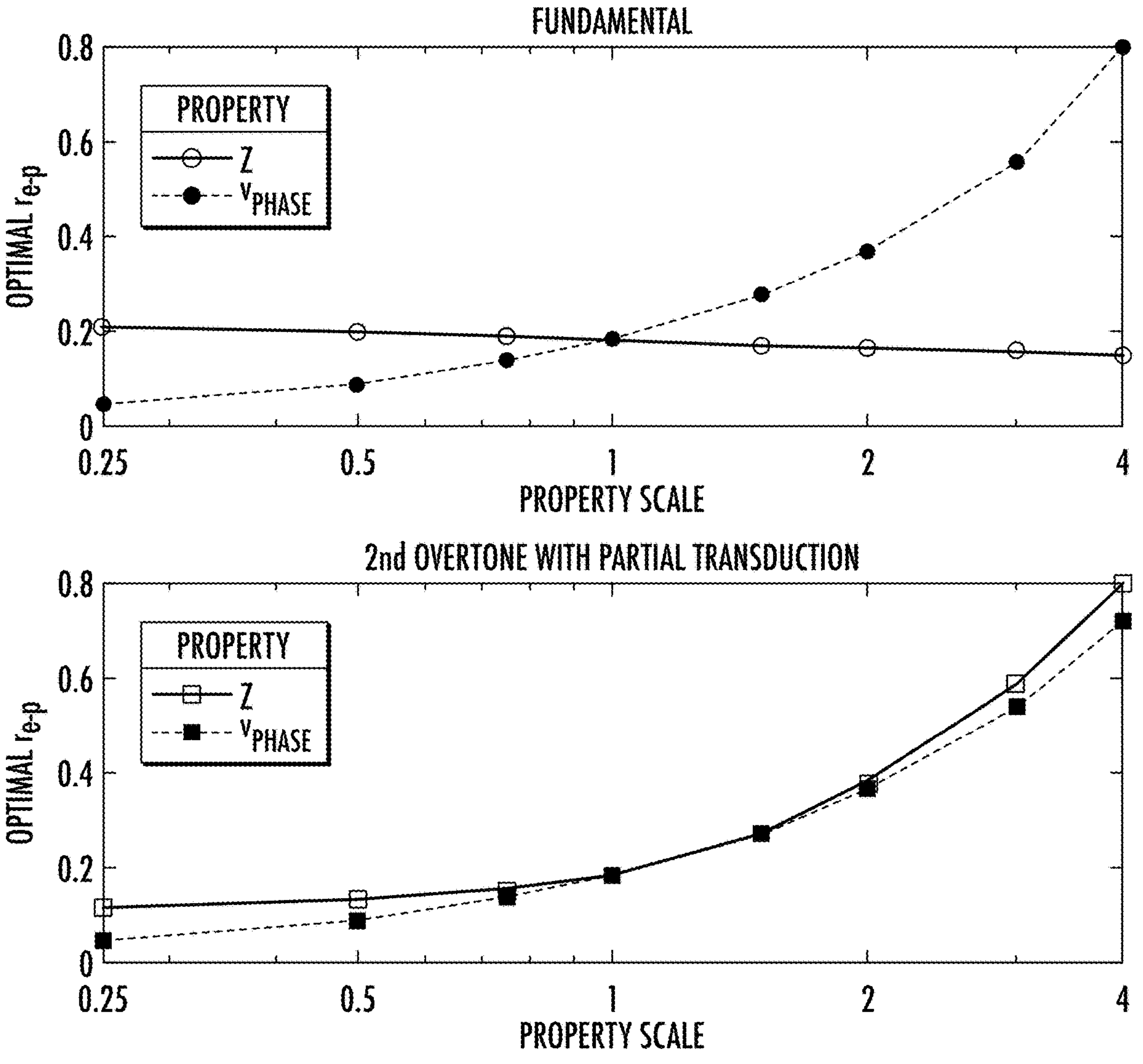
FIG. 6 shows the results of an FEA study scaling either acoustic impedance (Z) or phase velocity ($v_{phase}$) while fixing the other. This is implemented relative with scaling relative to AlN by scaling material density and stiffness. Graph shows optimal electrode to piezoelectric layer ratio (re-ρ) for maximum $k_t^2$ vs. relative scaling of Z or $v_{phase}$.
Figure 7:
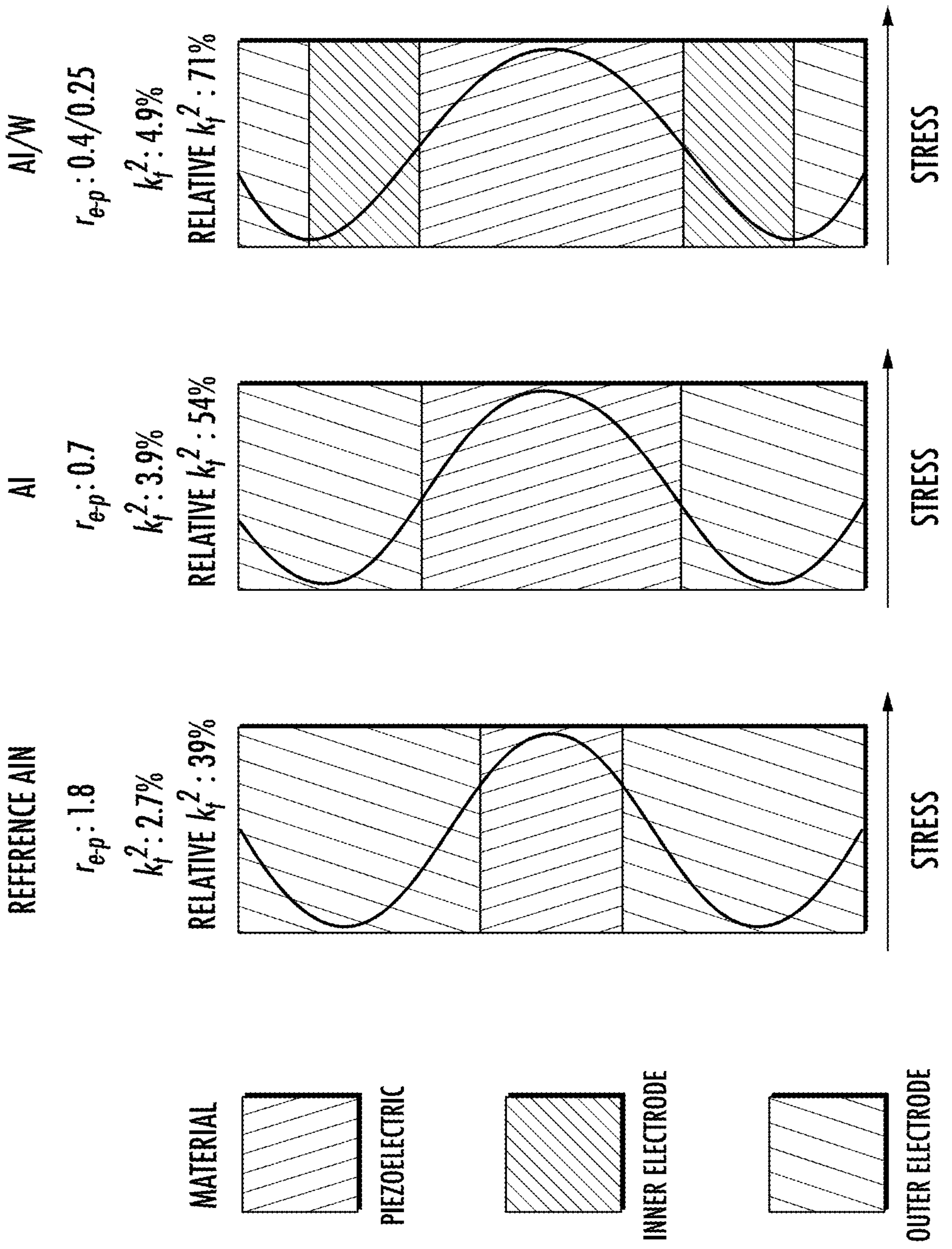
FIG. 7 shows the partially transduced 2nd overtone mode for a stack with AlN piezoelectric layer, inner low acoustic impedance (Z) metal, and outer high Z metal, showing stress distribution and electrode to piezoelectric layer ratio (re-ρ). Note the low Z Al, layered with high Z W, flattens the modeshape relative to the uniform.

$k_t^2$ can be enhanced much further by using a low Z material to decrease acoustic loading from the electrodes. The stiffer and lighter the better, with an unphysical material with 0 Z adding no load and allowing the full $k_t^2$ of the fundamental mode. Using the same 2D FEA simulations, the p and E of AlN can be scaled to sweep $v_{phase}$ or Z, related by Eq. (3) and Eq. (4), while keeping the other constant. For each point in these simulations, a secondary sweep of re-ρ can be run to generate curves similar to FIG. 5 and to determine optimal re-ρ and $k_t^2$. It is interesting to note that $v_{phase}$ has no impact on maximum $k_t^2$ but impacts the ratio of layer thicknesses needed to reach it. Instead, maximum $k_t^2$ is determined solely by Z. FIG. 7 shows the results of the simulations with respect to optimal re-ρ and mode $k_t^2$.

The results of all the simulations show that when re-ρ is optimal, low Z metals such as Al and Ti are the best choices. $k_t^2$ can be enhanced to 3.9% with A/electrodes and an AlN center.

This can be taken one step further by replacing the single material electrodes with dual layers consisting of an inner low Z metal, and an outer high Z metal. An outer layer of a high Z metal serves to better confine acoustic energy to the AlN layer as the modeshape is flattened out, causing a better stress distribution within the transduced region. Effectively the same enhancement effect causing $k_t^2$ enhancement in the fundamental mode as shown in FIG. 7.

Using an optimized Al/W pair with AlN, $k_t^2$ can be further increased to 4.9%, ~⅔ of the fundamental mode. However, using Ti/W allows 4.0% $k_t^2$ and results in a better Q. This is much better than the 2.3%(⅓ fundamental mode) $k_t^2$ achievable from a uniform property and thickness stack.

To avoid the need for external matching networks, the characteristic impedance of a filter needs to be matched to the proceeding and following stages, typically at 50Ω. With respect to an individual resonator, this means that to be matched, the $C_0$ must have a specific value dependent on the filter center frequency. While some bandpass filter implementations such as ladder filters can use a higher than 1:1 capacitive ratio between shunt and series devices to improve roll off, this ratio does not typically exceed 4, meaning the match capacitance will be within 0.5-2 times the value set by Eq. (5):

$$C_0 = \frac{1}{2\pi \cdot f \cdot Z0 \cdot \sqrt{r}} \quad (5)$$

where:

f is frequency;

Z0 is the characteristic impedance of the system (normally 50Ω); and r is the capacitive ratio between shunt and series filter elements.

For OBARs, $C_0$ is formed by two parallel plates which have a separation distance determined by resonant frequency and a dielectric permittivity dependent on the piezoelectric material choice. For a 50Ω match, the separation distance is much smaller than the device area, so the parallel plate approximation in Eq. (6) is reasonable.

$$C_0 = \frac{\varepsilon_r \cdot \varepsilon_0 \cdot A}{d} \quad (6)$$

where:

$\varepsilon_r$ is relative dielectric permittivity;

$\varepsilon_0$ is vacuum dielectric permittivity;

A is device area; and d is separation distance.

Lateral dimensions have an impact on device performance that go beyond the value of $C_0$. The mode shape has been discussed for infinitely wide cavities. In real devices, lateral dimensions impact mode shape, lowering $k_t^2$ and lowering Q through anchor loss. While techniques such as frames and etch trenches can limit anchor loss, ultimately there is still a proportionality between loss and the vertical to lateral cavity ratio.

Figure 8:
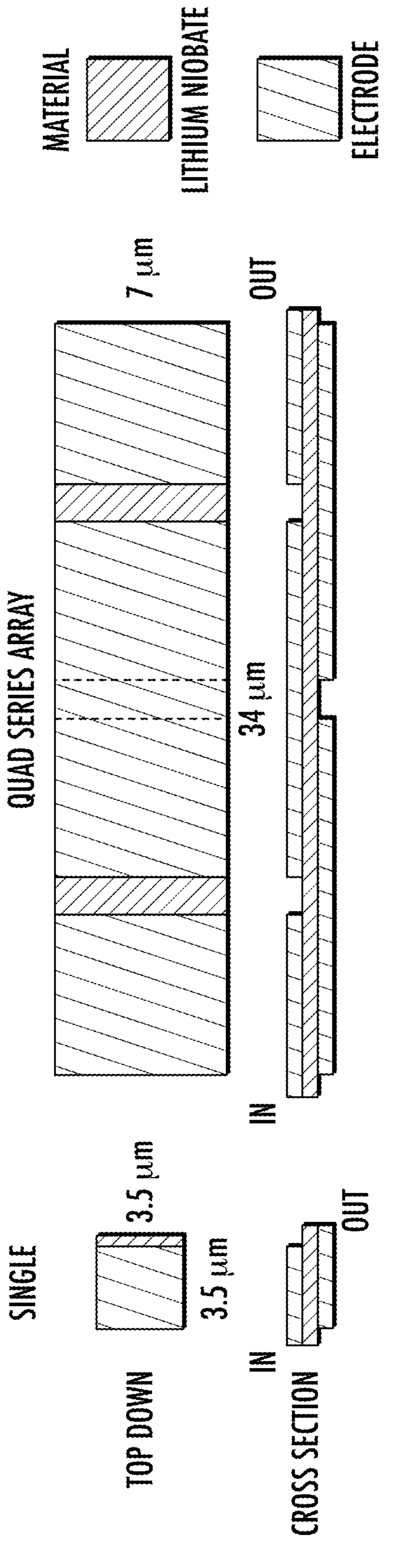
FIG. 8 is a schematic showing single vs quad series array with 500 characteristic impedance implemented in Lithium Niobate, providing increased device area for quad series array.

One way around this is to array multiple resonators in series, to allow the use of larger areas while still not exceeding the capacitance requirements. This often presents challenges for device interconnects and large footprints. Using the solidly mounted approach with thick electrodes minimizes ohmic loss tradeoffs, allowing more than 8 series devices with less than 10% ohmic loss for expected upper limits of $k_t^2$ and Q. Using a high dielectric permittivity material like LN and operating at high frequency (thin separation distance) allows small footprints even for large series arrays. A 50Ω matched series array comprised of 4 resonators still occupies less than 250 μm$^2$ of area. This has further advantages for power handling, as having multiple resonators in series, as shown in FIG. 8, reduces the electric field across each device.

Films can only be made so thin, and scaling up resonator frequency requires scaling down film thickness. In devices where the metal electrodes are in the path of the acoustic wave, the electrode material and thickness also play a role in setting center frequency. Adjusting the ratio of electrode to piezoelectric thickness (re-ρ) can improve this limit by increasing one layer thickness at the cost of the other. At any given frequency, the OBAR has a 2-3.5 times thicker piezoelectric layer and 5-10 times thicker metal electrodes than a fundamental mode device, allowing practical fabrication of devices in the 30-60 GHz range. Because electrode resistance is inversely proportional to thickness, electrical loading is also greatly reduced in OBAR structures.

In other words, the OBAR allows for the central piezoelectric layer to have the thickness it would in an unmetalized fundamental mode, while possessing metal much thicker than the most metalized thin film bulk acoustic wave resonators.

Beyond manufacturability, thinner metal layers present a series challenge for ohmic loss. Ohmic loss refers to loss caused by the finite conductivity of the metal electrodes. In brief, ohmic loss ($R_S$) is the electrical resistance due to the finite conductivity of metal electrodes, and is proportional to the device geometry as expressed by Eq. (7):

$$R_s \propto t\frac{l}{w} \tag{7}$$

where:

t is thickness;

l is length; and w is width.

The electrical loading (impact on Qs) caused by this resistance is dependent on its ratio to resonator impedance at series resonance. For a resonator matched to a specific $Z_0$ such as 50Ω, meeting a target $k_t^2$ and Q, this series resonance impedance is frequency independent. Because $R_m$ is in this case frequency independent, but $R_s$ is inversely proportional to frequency, ohmic loss scales as 1/f.

Figure 9:
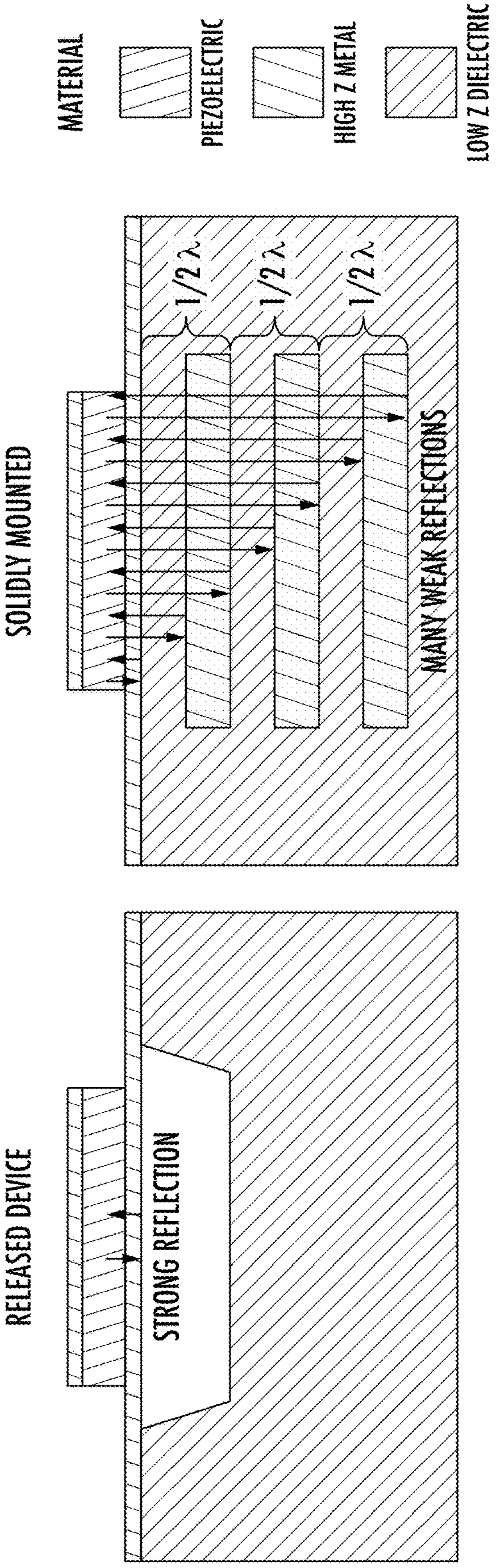
FIG. 9 is a schematic showing acoustic cavity definition for released and solidly mounted resonators.

For a resonator to function, an acoustic cavity must be formed with boundaries to reflect elastic waves. To do this, an acoustic impedance mismatch is needed at the cavity edge to reflect energy. The high acoustic impedance mismatch between the solid materials composing a resonator and air is ideal for this and often used to define a resonator's cavity and prevent energy from propagating beyond its boundaries. Energy can instead be confined without an air interface by using the acoustic impedance mismatch between different solid materials. However, this acoustic impedance mismatch is much lower than air, resulting in poor confinement. To improve reflection, Bragg mirrors, also called Bragg reflectors, can be used. Bragg mirrors function using a series of interfaces with mismatched acoustic impedance precisely spaced so that the reflections constructively interfere. A common approach is to alternate ¼ λ thick layers of high and low Z materials, as seen in the FIG. 9. The better the Z mismatch between the materials, the more reflective the Bragg mirror. The reflectivity of the Bragg Mirror can be increased further by adding more layers.

Not releasing the devices has benefits. First, fabrication and packaging can often be simplified if the final structure is not a suspended thin film. Additionally, the robustness of resonators with respect to shock is better when they are not composed of a suspended thin film. Finally, power handling in resonators is often limited by the build-up of heat. Suspended thin films devices must sink heat laterally through the thin film, which has much higher thermal resistance than unreleased devices that sink heat straight down. These stability improvements can be taken further by additionally encapsulating the top electrode.

Figure 10:
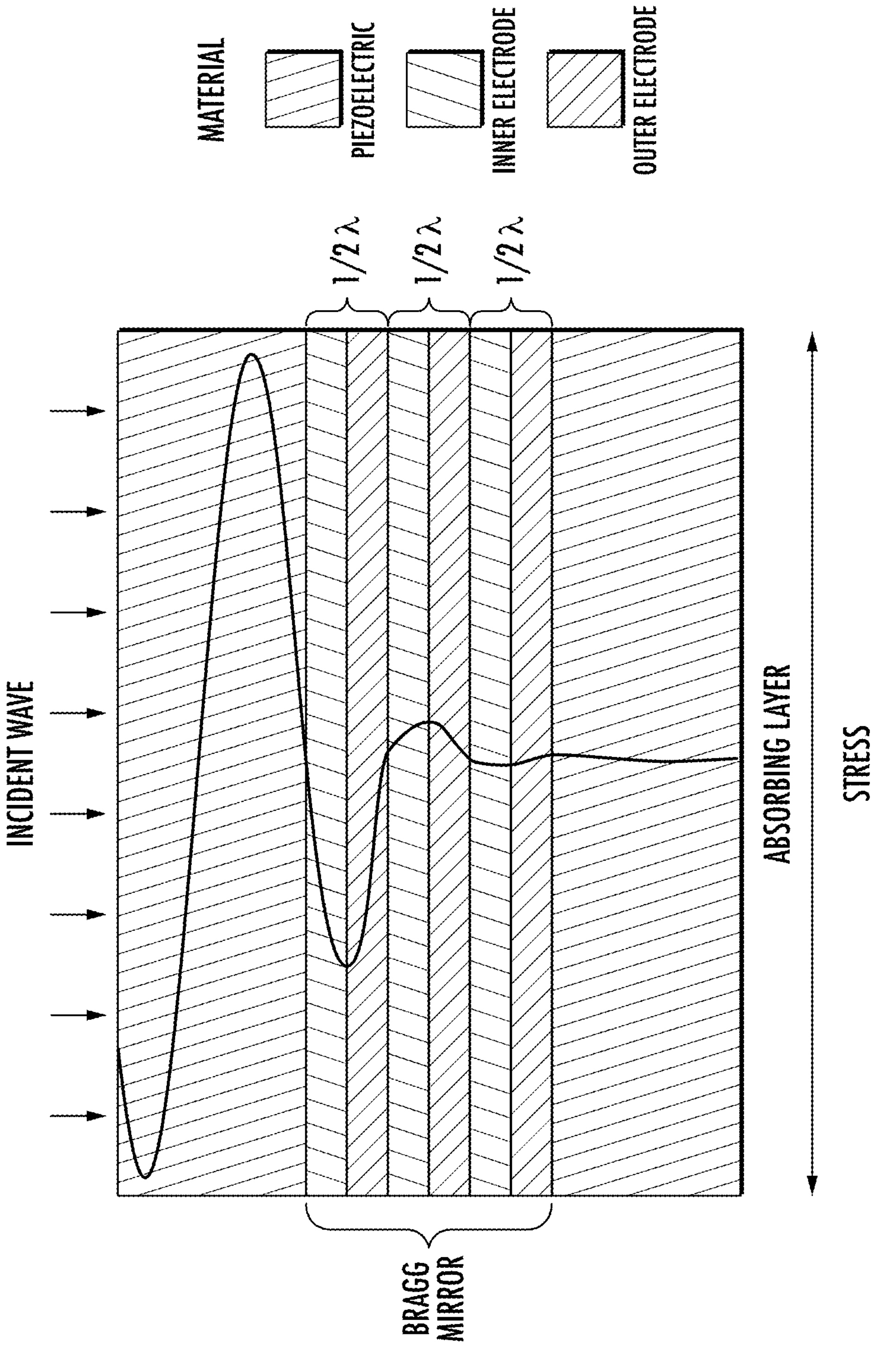
FIG. 10 is a schematic showing Bragg mirror model with incident wave and absorbing layer, overlayed with stress distribution.

Frequency scaling of thickness mode devices results in extremely thin metal electrodes, which have high ohmic loss. Most Bragg mirror implementations are not conductive. However, some devices have been made using high and low Z metals to form the Bragg mirror. The disclosed device uses top and bottom all metal Bragg mirrors to allow arbitrarily thick metal electrodes, resulting in minimal ohmic loss. Because the separation distance between interfaces is dependent on metal thickness, and to reflect needs to be ¼ λ, reflection is not broadband but rather at specific frequencies. For the SBAR, this is matched to the 2nd overtone within the active region. At the fundamental mode frequency (i.e., ~⅓ the 2nd overtone frequency), Bragg mirror spacing is too far from ¼ λ to be reflective, suppressing this mode. In other words, the fundamental mode at ⅓ device target frequency is now suppressed by being leaked into the substrate, as shown in FIG. 10. This is advantageous for filter implementations as it results in a resonator with a clean broadband response and no unwanted resonant modes.

The fabrication techniques will now be disclosed in the context of specific, exemplary devices. As would be realized, the invention is not meant to be limited by the specific exemplary embodiments, which are offered only to illustrate the fabrication process. Two embodiments are described, a released OBAR embodiment and a SBAR embodiment.

The fabrication of the OBAR embodiment will now be disclosed. The exemplary device is a released OBAR functioning at 33 GHz. The device exhibits ~50Ω matched Pt—AlN—Al OBAR operating at 33 GHz with 1.7% $k_t^2$ and series resonance Q>100.

For the thickness dimension, the stack consists of a 70 nm Pt bottom electrode with 10 nm Cr adhesion layer, 140 nm AlN piezoelectric layer, and 90 nm Al top electrode. While a Pt bottom electrode is suboptimal for $k_t^2$, the process for depositing very thin AlN on Pt layers can be tuned.

Figure 11:
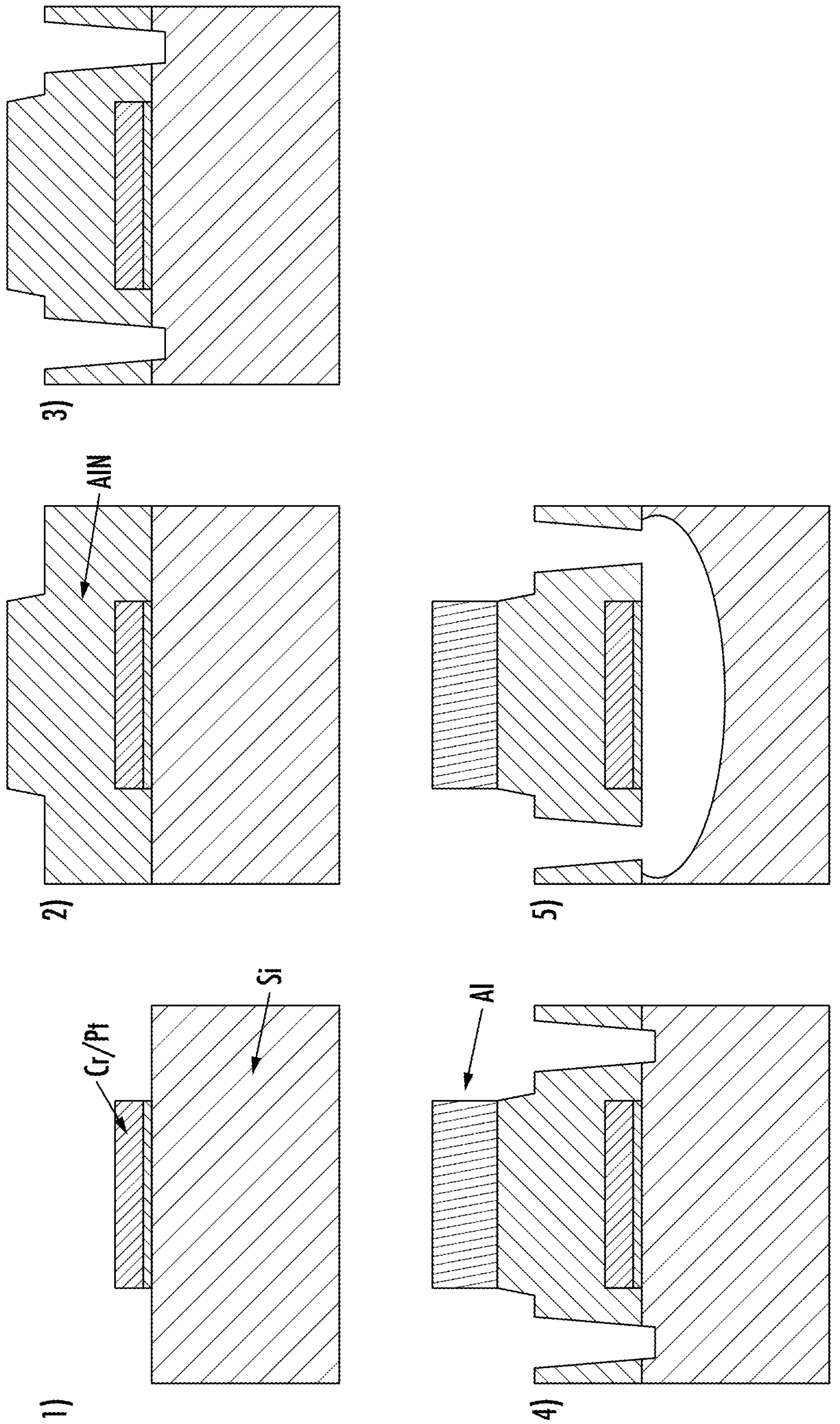
FIG. 11 shows steps of the OBAR fabrication process.
Figure 12:
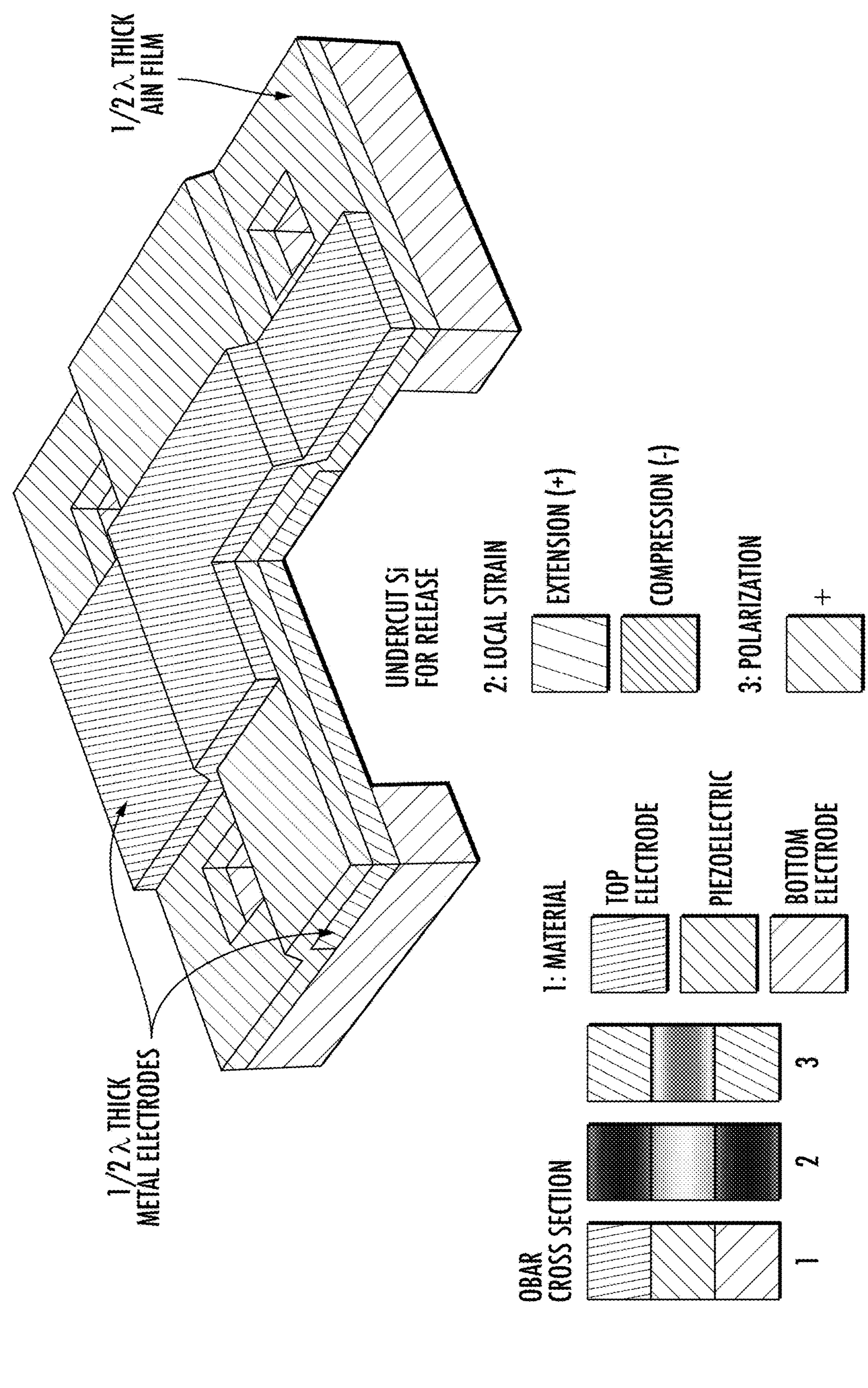
FIG. 12 is an isometric 3D rendering of an OBAR with cutaway cross section views colored by 1 material, 2 local strain, 3 polarization.

A 3-mask process is used for fabrication as shown in steps (1)-(5) of FIG. 11. In step (1) a 70 nm Pt layer with a 10 nm Cr adhesion layer is blanket DC-sputtered onto a high-resistivity Si wafer to form the bottom electrode. Pattering is then done by ion milling of the Pt and Cr layers with a dielectric mask (e.g., photoresist). This results in a more continuous piezoelectric film, compared to liftoff. In step (2) the piezoelectric material, (e.g., AlN, ScAlN, Ln and many others) is deposited at low power (3 KW) using an AMS sputtering tool. In step (3) the piezoelectric material is wet etched in heated CD26 (TMAH). In step (4) 90 nm of Al is DC sputtered and patterned by liftoff. Finally in step (5) the Si is undercut to release the active region using $XeF_2$. Note that, because the top and bottom electrodes of this device are routed at 90° instead of 180°, changing aspect ratio increases resistance of one electrode and decreases resistance of the other, making ohmic loss mainly independent of the aspect ratio. For these OBARs this loss is calculated to be <10% of the total loss for the overtone mode. An isometric 3D rendering of the device is shown in FIG. 12.

The fabrication of the SBAR embodiment will now be disclosed. SBAR uses all of the features previously described to implement an implementable mmWave acoustic resonator. First, the active region of the device functions in a 2nd overtone thickness mode split between the piezoelectric and active metal layers. This approach allows a piezoelectric layer thickness almost the same as an unmetallized fundamental mode. Second, the use of optimized active metal layers consisting of a low acoustic impedance inner layer and higher acoustic impedance outer layer allows a $k_t^2$ of almost ⅔ the fundamental mode (~4.7% for pure AlN, 15.6% for Y-36° LN). Third, the use of all metal Bragg mirrors to define the primary acoustic cavity allows the electrodes to be arbitrarily thick making ohmic loss minimal even for 50Ω matched high $k_t^2$*Q devices, as well as providing full encapsulation. Fourth and finally, using a layer transfer based fabrication process enables design freedom for choice of materials.

For sputtered films such as AlN or ScAlN this allows optimal selection of seed layer for growth, or in the case of single crystal materials such as Lithium Niobate this allows fabrication of devices starting from commercially available thin films on silicon.

Fabrication plays a critical role for these devices. For optimal $k_t^2$ the metal layer contacting the piezoelectric must be low Z. Based on modeling of the quality factor, Ti appears to be the best choice for this layer, although other metals may be used.

Additionally, roughness of the layers closest to the center piezoelectric has the largest impact on device performance. Instead of attempting to grow high quality AlN on top of a thick metal stack capped by Ti, a layer transfer process is used. This has the added benefit of allowing compatibility with single crystal piezoelectric materials such as Lithium Niobate or Lithium Tantalate which would allow for higher $k_t^2$.

Figure 13:
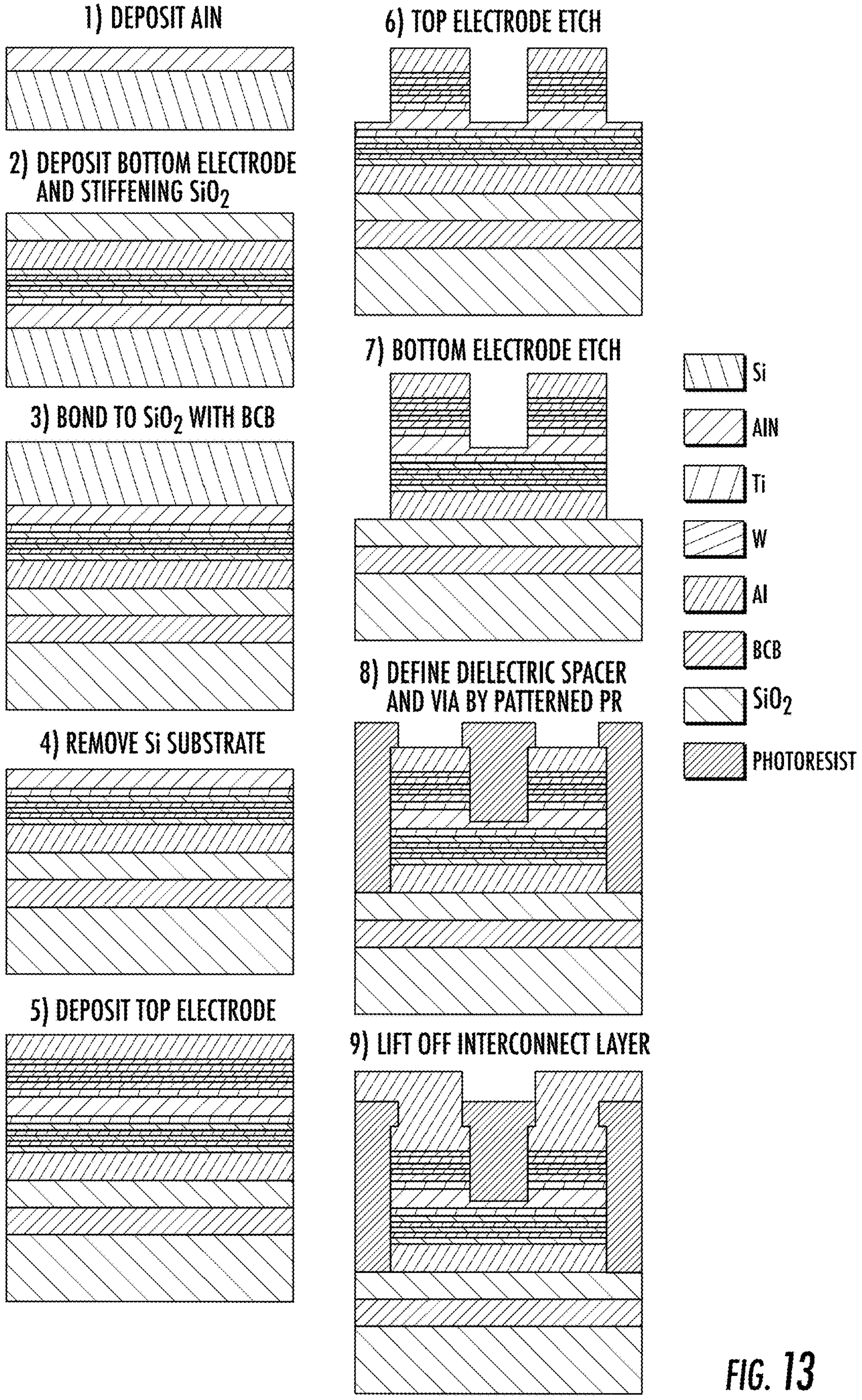
FIG. 13 shows steps of the SBAR fabrication process.
Figure 15:
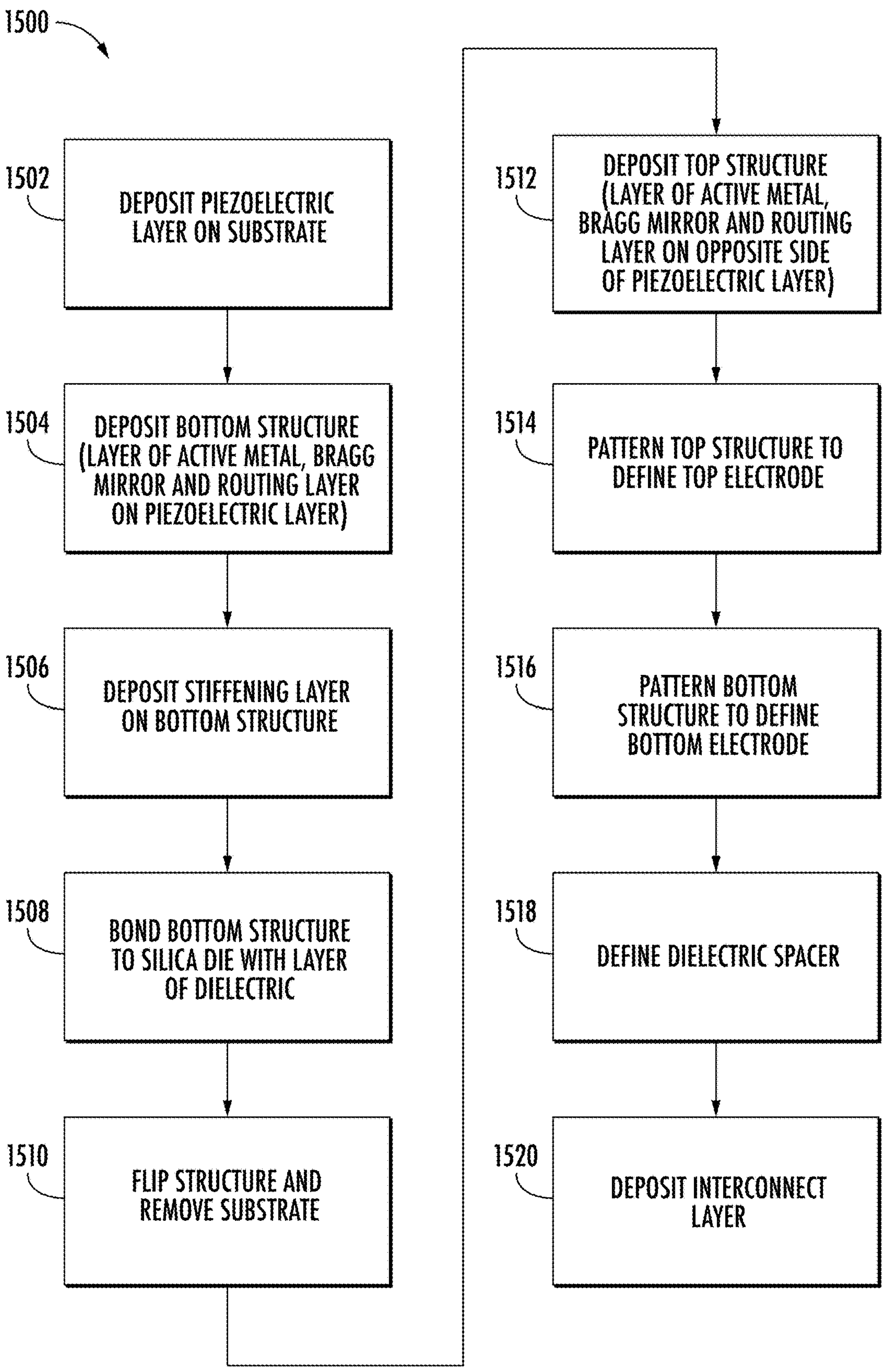
FIG. 15 is a flowchart showing the SBAR Fabrication process.

Devices are fabricated using a 9-step, 3-mask process shown schematically in FIG. 13. And in flowchart form in FIG. 15. In step 1502 (1), a layer of a piezoelectric material (e.g., a 110 nm layer of AlN, ScAlN, LN, and many others), is deposited on a substrate (e.g., a Si handler die) in one embodiment using a reactive co-sputter tool with a low power recipe optimized for very thin films. Preferably, the piezoelectric layer will be ~½ wavelength in thickness.

In step 1504 (2), the bottom structure is deposited, comprising an active metal layer, an all-metal Bragg mirror and thick routing layer (preferably 400 nm thick Al), which is sputter deposited on the piezoelectric layer, optionally followed by a $SiO_2$ (1.6 um) stiffening layer at Step 1506. The stiffening layer is extremely useful for preventing the spread of cracks from any bubbles or other defects in the bonding process. The active metal layer is also a low acoustic impedance metal, preferably Ti, which has lower mechanical loss, but higher electrical resistance than Al. Because more mechanical energy is present at the inner layer, using Ti instead of Al will reduce loss in the device (i.e., will improve Q). In other embodiments, other low acoustic impedance materials (e.g., Al) may be used as the active metal layer.

The all-metal Bragg mirrors are composed of multiple mirror pairs comprising alternating layers of a low acoustic impedance metal and a high acoustic impedance metal. In a preferred embodiment, the low acoustic impedance material is Al and the high acoustic impedance metal is W. Each mirror pair (low impedance metal layer and high impedance metal layer) is ~½ wavelength thick, with each layer being ~¼ wavelength thick. However, there are other mirror thickness schemes to reflect shear modes. The Bragg mirror may have any number of mirror pairs. Additional reflections from each layer provides better confinement of the acoustic energy, but at a higher fabrication cost.

In step 1508 (3), the initial Si die with deposited layers is flip chip bonded to a new second substrate (glass, silicon, sapphire, silica, etc.) using a dielectric interface layer. Any dielectric material may be used, however, in certain embodiments, divinylsiloxane-bis-benzocyclobutene (BCB) is used for the interface layer. First, both dies are wet cleaned, undergo $O_2$ plasma barrel ashing, and are then dehydrated in an oven. Then the second substrate is spin coated with 3.8 μm BCB (e.g., Cyclotene 3022-46) and after a 3 minute, 85° C. post application bake, bonded to the initial Si substrate using ramped temperature and pressure in a flip chip bonding tool. The BCB should not be baked in atmosphere to ensure that an $SiO_2$ layer does not form at the surface, and using ramped temperature and pressure allows formation of a good bond layer with minimal bubbles or cracks. Also, using substrate (e.g., a fused silica handler die) larger than our initial Si die 2.5×2.5 cm vs 1.1×1.3 cm and only spinning BCB on the substrate prevents failed contact due to edge bead effects. After the final hard bake, the BCB is resistant to >12 hour exposure to wet solvents such as acetone, IPA, and 1165 heated to 80° C.

In step 1510 (4), the structure may be flipped for ease of fabrication and the substrate is removed. The Si handler is thinned from 500 to 50 μm using $SF_6/O_2$ RIE, cleaned of etch residue, and then the final Si is removed using $XeF_2$ to prevent surface damage to the AlN film. Any remaining F-based residue from the Si can be removed through a wet clean process consisting of immersion in acetone, IPA, then deionized water.

In step 1512 (5), the top structure is deposited comprising an active metal layer, all metal Bragg mirror and a thick routing layer (preferably 400 nm thick Al) which is sputter deposited. Note that it is not necessary that the Bragg mirrors in the top structure and bottom structure be identical. The Bragg mirrors may be composed of different materials and/or may have different numbers of mirror pairs.

In step 1514 (6), ion milling is used to define the top electrode. Etching is stopped in the middle of the piezoelectric layer to prevent any shorting between top and bottom electrode due to redeposition. Additionally, instead of using a fixed 22.5° angle, the first third of the total etch time is milled at a shallow 45° angle and the final two thirds of the time at a sharp 5° angle to prevent redeposition of material in the trench between series top electrodes. In step 1516 (7), a second ion milling step with the same methodology is used to define the bottom electrode, stopping on the $SiO_2$ stiffening layer.

In step 1518 (8), a dielectric material, for example, Photoresist, is used as a planarization and via layer by spinning, pattering, and then hard baking to fully cross link.

Figure 14:
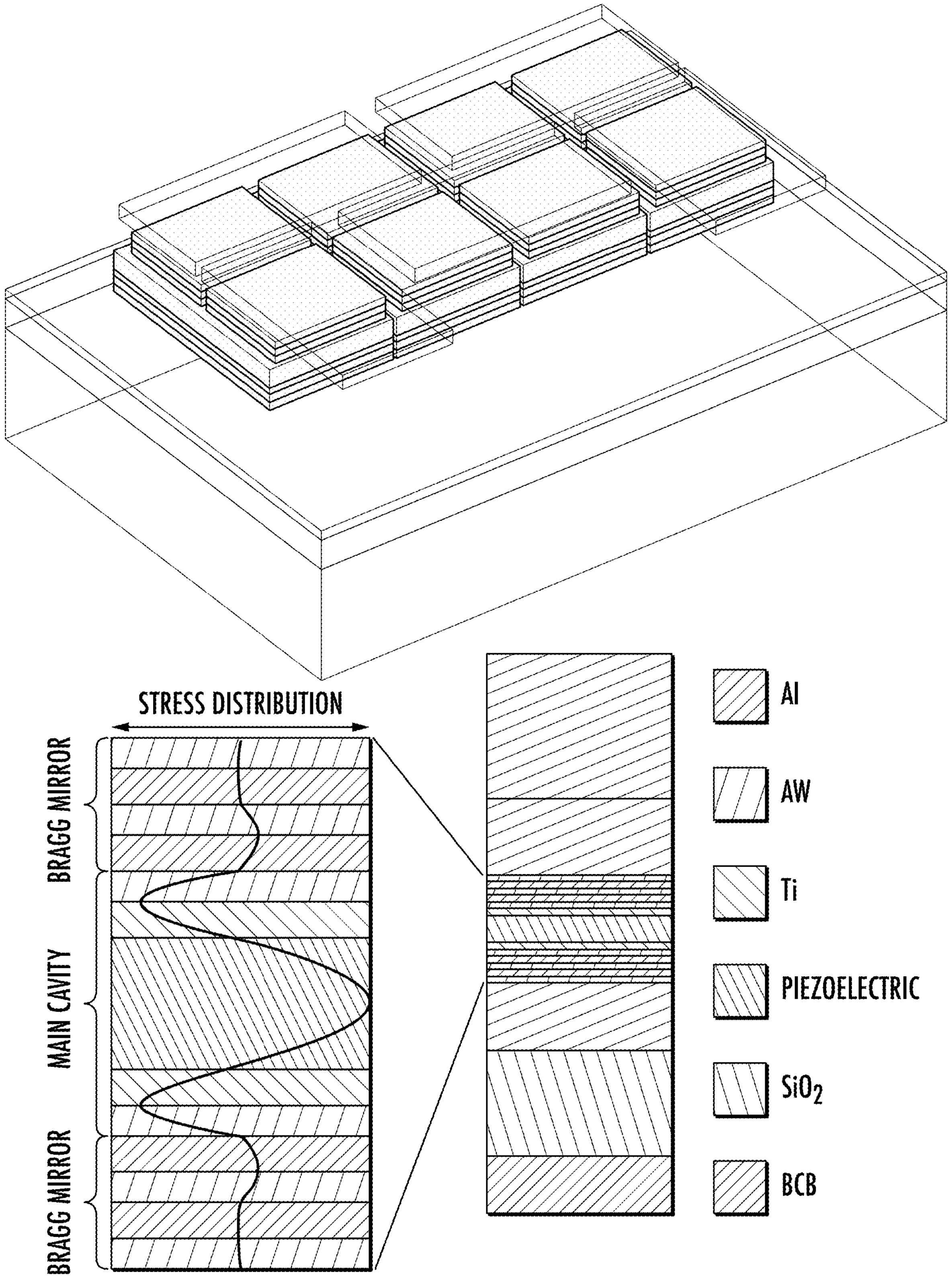
FIG. 14 is a schematic of an SBAR showing isometric view of an 8X series arrayed device, dual Bragg mirrors encapsulated by thick metal interconnects confining stress, and the $SiO_2$/BCB/$SiO_2$ low loss substrate used for layer transfer process.

Finally, in step 1520 (9), a thick (1.5 μm) Al interconnect layer is deposited and patterned using liftoff. This A/layer fills the via holes left in the photoresist, connects devices together for series arrays, and is contacted by probes to allow measurements. Multiple SBAR devices are shown connected in series in schematic and isometric views in FIG. 14.

The disclosed acoustic resonators have a role to play in filtering at mmWave frequencies. While frequency dependence of intrinsic loss mechanisms mean Q of these devices will not equal that of sub-6 GHz resonators, Q requirements are not as stringent for mmWave applications.

The OBAR uses a set of key features including a 2nd overtone thickness mode split between the piezoelectric and active metal layers, series arrays of devices, and all metal Bragg mirrors if solidly mounted to allow a practical to manufacture device capable of meeting $k_t^2$ and Q requirements. $k_t^2$ can be kept up to ⅔s of a fundamental mode meaning up ~4.7% for pure AlN, and 15.6% for Y-36° LN. The disclosed OBAR device presents a practical approach to acoustic resonator design for mmWave filtering.

As would be realized by those of skill in the art, the specific examples discussed herein have been provided only as exemplary embodiments and the invention is not meant to be limited thereby. Modifications and variations are intended to be within the scope of the invention, which is given by the following claims:

The invention claimed is:

1. A solidly-mounted overmoded acoustic resonator tuned to a fundamental frequency, comprising:

a substrate;

a layer of BCB, disposed on the substrate;

a dielectric layer disposed on the layer of BCB;

a first routing layer disposed on the dielectric layer;

a first Bragg mirror comprising one or more pairs of alternating layers of a high impedance metal and a low impedance metal, the first Bragg mirror disposed on the first routing layer;

a first active metal layer disposed on the first Bragg mirror;

a main cavity disposed on the first active metal layer, the main cavity comprising a layer of piezoelectric material;

a second active metal layer disposed on the main cavity;

a second Bragg mirror comprising one or more pairs of alternating layers of a high impedance metal and a low impedance metal, the second Bragg mirror disposed on the second active metal layer; and a second routing layer disposed on the second Bragg mirror;

wherein a layer of low impedance metal from the first Bragg mirror and a layer of low impedance metal from the second Bragg mirror are in direct contact with the first and second active metal layers, respectively;

wherein each metal layer in the first and second Bragg mirrors is ¼ the wavelength of the fundamental frequency in thickness;

wherein the first and second active metal layers are composed of Ti;

wherein the first and second routing layers are composed of a layer of Al approximately 400 nm in thickness; and wherein the acoustic resonator operates in a partially transduced $2^{nd}$ overtone mode split between the main cavity and the low impedance metal layers of the first and second Bragg mirrors that are in direct contact with the piezoelectric material of the main cavity.

2. The acoustic resonator of claim 1 wherein the acoustic resonator is milled to define a top electrode and a bottom electrode.

3. The acoustic resonator of claim 1 further comprising: an interconnect layer disposed on the second routing layer.

4. The acoustic resonator of claim 1 wherein the high acoustic impedance metal is Tungsten and the low acoustic impedance metal is Aluminum.

5. A system comprising a plurality of the acoustic resonators of claim 3 connected in series via their respective interconnect layers.

* * * * *